(12) United States Patent
Yao et al.

(10) Patent No.: US 10,036,188 B1
(45) Date of Patent: Jul. 31, 2018

(54) HINGE AND A FOLDABLE ELECTRONIC DEVICE WITH THE SAME

(71) Applicant: FIRST DOME CORPORATION, New Taipei (TW)

(72) Inventors: Hsu-Hong Yao, New Taipei (TW); Kuei-Shen Chen, New Taipei (TW); Yi-Cheng Liao, New Taipei (TW)

(73) Assignee: First Dome Corporation, New Taipei (TW)

( * ) Notice: Subject to any disclaimer, the term of this patent is extended or adjusted under 35 U.S.C. 154(b) by 0 days.

(21) Appl. No.: 15/819,471

(22) Filed: Nov. 21, 2017

(30) Foreign Application Priority Data

Jun. 8, 2017 (TW) .............................. 106208243 U

(51) Int. Cl.
| G06F 1/16 | (2006.01) |
| E05D 3/12 | (2006.01) |
| H05K 5/02 | (2006.01) |
| H05K 5/00 | (2006.01) |

(52) U.S. Cl.
CPC ........... *E05D 3/122* (2013.01); *H05K 5/0017* (2013.01); *H05K 5/0226* (2013.01)

(58) Field of Classification Search
CPC .... G06F 1/1615; G06F 1/1616; G06F 1/1681; H05K 5/0226
See application file for complete search history.

(56) References Cited

U.S. PATENT DOCUMENTS

| 9,518,414 | B1 * | 12/2016 | Chen ...................... G06F 1/1681 |
| 9,823,706 | B2 * | 11/2017 | Chen ...................... G06F 1/1681 |
| 2011/0001405 | A1 * | 1/2011 | Tsao ...................... G06F 1/1681 |
|  |  |  | 312/223.1 |
| 2012/0042473 | A1 * | 2/2012 | Wang ..................... G06F 1/1681 |
|  |  |  | 16/319 |
| 2012/0113614 | A1 * | 5/2012 | Watanabe ........... G02F 1/13336 |
|  |  |  | 361/810 |
| 2014/0340832 | A1 * | 11/2014 | Kwon ................. H04M 1/0216 |
|  |  |  | 361/679.27 |
| 2015/0378397 | A1 * | 12/2015 | Park ...................... G06F 1/1652 |
|  |  |  | 361/679.27 |

* cited by examiner

*Primary Examiner* — Anthony Q Edwards
(74) *Attorney, Agent, or Firm* — LeClairRyan

(57) ABSTRACT

A hinge includes a base frame, a mechanically transmitting assembly and two support frames. The base frame defines two guideways disposed opposite to each other in a front-and-rear direction. The mechanically transmitting assembly is mounted on the base frame and partly disposed in the guideways. Each support frame has an arcuate frame body slidably engaging the respective guideway and coupled with the mechanically transmitting assembly, and a support frame body disposed outwardly of the base frame. The support frames are rotatable about a rotating axis relative to the base frame to make synchronous rotation in opposite rotational directions through the mechanically transmitting assembly. The rotating axis is disposed above the base frame.

20 Claims, 10 Drawing Sheets

HINGE AND A FOLDABLE ELECTRONIC DEVICE WITH THE SAME

CROSS-REFERENCE TO RELATED APPLICATION

This application claims priority of Taiwanese Patent Application No. 106208243, filed on Jun. 8, 2017.

FIELD

The disclosure relates to a hinge, and more particularly to a hinge having two synchronously rotatable axles, and a foldable electronic device with the same.

BACKGROUND

A conventional dual-screen electronic device (such as cellular phones, tablets, laptops, E-readers, etc.) generally has a foldable structure in which a hinge interconnects two sections of the conventional electronic device to permit transformation of the sections between unfolded and folded states.

With the provision of the hinge, a gap is formed between the sections for ensuring smooth operation of the hinge and for preventing the sections from hitting each other during rotation. Thus, in the unfolded state, a relatively large distance exists between display screens of the sections, which adversely affects the touch operation of the display screens.

SUMMARY

Therefore, an object of the disclosure is to provide a hinge and a foldable electronic device with the same that can alleviate at least one of the drawbacks of the prior art.

According to the disclosure, a hinge includes a base frame, a mechanically transmitting assembly and two support frames. The base frame defines two guideways disposed opposite to each other in a front-and-rear direction and spaced apart from each other in the front-and-rear direction. The mechanically transmitting assembly is mounted on the base frame and partly disposed in the guideways. The support frames are disposed opposite to each other in the front-and-rear direction. Each of the support frames has an arcuate frame body configured to slidably engage the respective guideway and coupled with the mechanically transmitting assembly, and a support frame body extending laterally from the arcuate frame body to be disposed outwardly of the base frame. The support frames are rotatable about a rotating axis relative to the base frame to make synchronous rotation in opposite rotational directions through the mechanically transmitting assembly. The rotating axis is parallel to the front-and-rear direction, and is disposed above and spaced apart from the base frame in an upright direction.

According to the disclosure, a foldable electronic device includes two sections and the hinge described above. Each of the sections has a major surface and a minor surface connected to the major surface at a juncture. The hinge interconnects the sections. The support frame body of each support frame is retainingly connected to the respective section. The support frames are rotatable to transform the sections between an unfolded state, where the sections are arranged in a left-and-right direction transverse to the front-and-rear direction, the major surfaces of the sections are coplanar, and the minor surfaces face each other, and a folded state, where the major surfaces face each other. In the unfolded state, the juncture is not located above the rotating axis.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
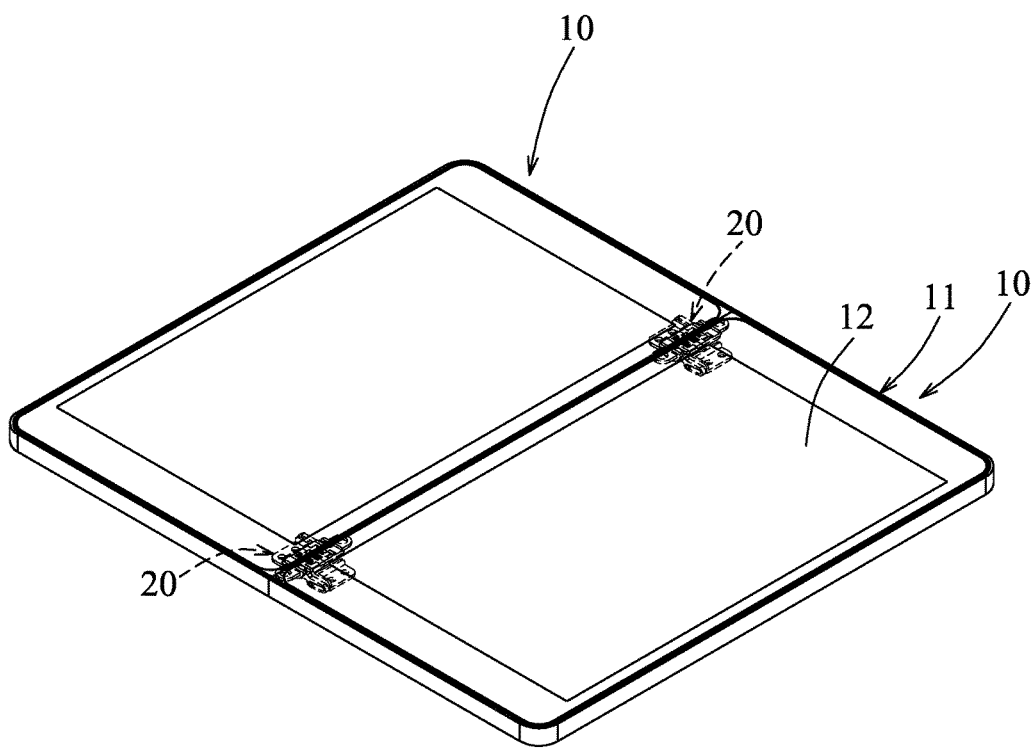
FIG. 1 is a perspective view of a first embodiment of a foldable electronic device according to the disclosure, illustrating two sections thereof in an unfolded state.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
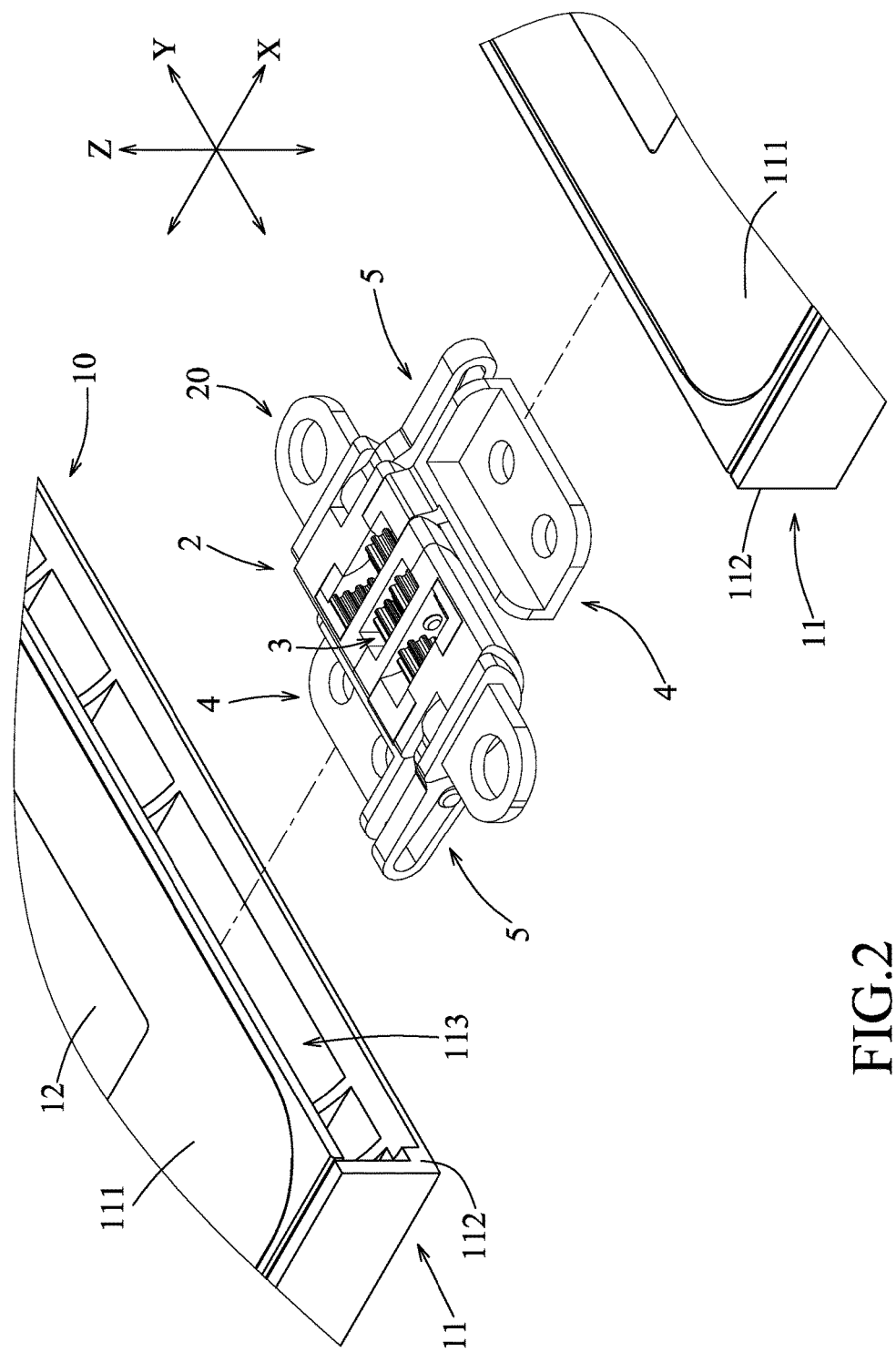
FIG. 2 is a fragmentary perspective view of the first embodiment, illustrating the sections and a hinge.

Referring to FIGS. 1 and 2, a first embodiment of a foldable electronic device 100 may be a cellular phone, a tablet, a laptop, an E-reader, or the like, and includes two sections 10 and two hinges 20.

The sections 10 are arranged in a left-and-right direction (X). Each of the sections 10 has a housing 11 and a display screen 12. The housing 11 has a major surface 111 facing upwardly, and a minor surface 112 which is vertically connected to a side of the major surface 111 at a juncture (P) (see FIG. 9). The housing 11 defines a space 113 opened at the minor surface 111. The display screen 12 is a touch screen disposed on the housing 11 and exposed from the major surface 112. The hinges 20 are spaced apart from each other in a front-and-rear direction (Y) transverse to the left-and-right direction (X). Each of the hinges 20 is disposed in the spaces 113 of the housings 11 and is connected between the housings 11.

The number of the hinges 20 can vary according to the dimension of the sections 10, and may be one or more than two.

Figure 3:
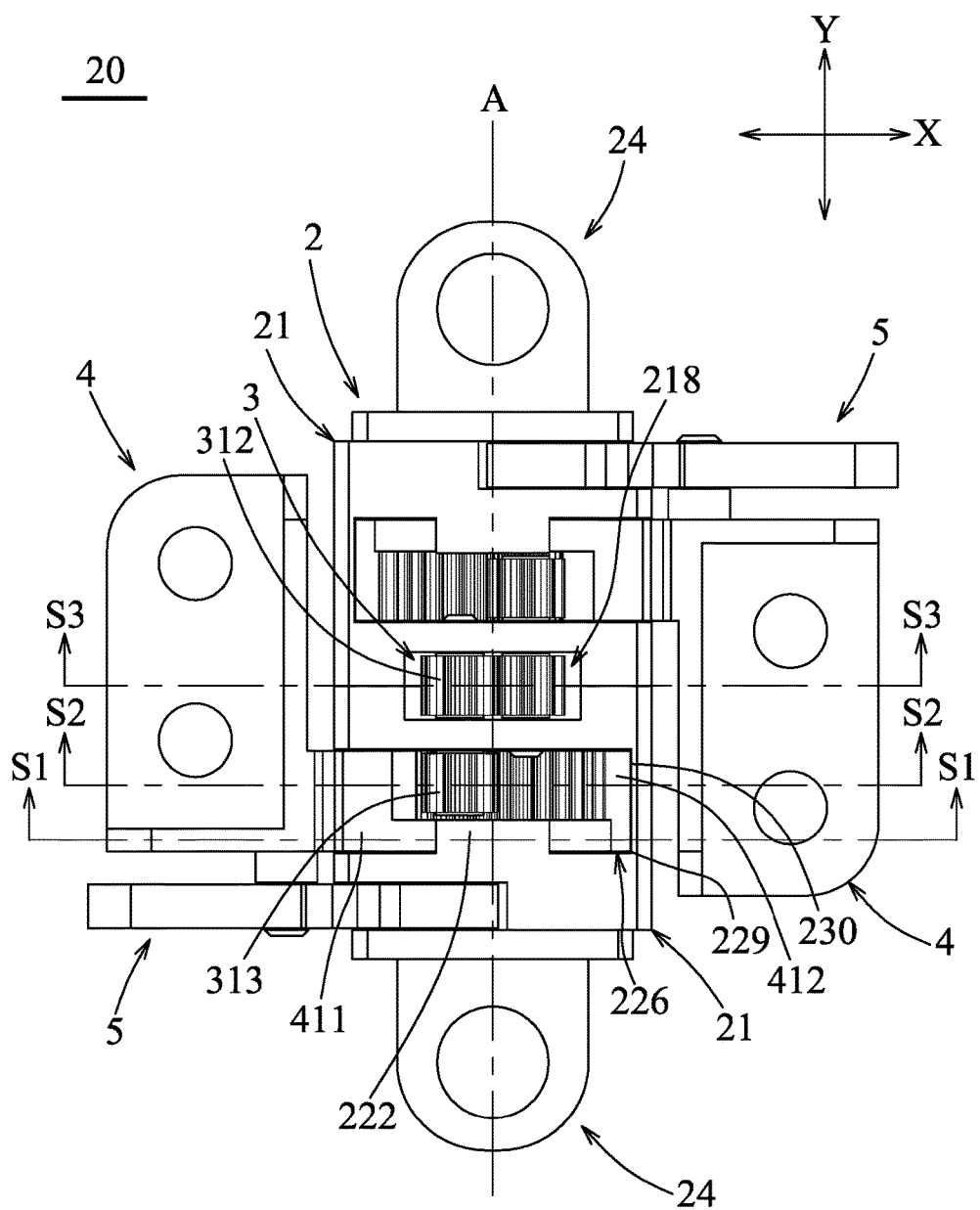
FIG. 3 is a top view of the hinge, illustrating two support frames thereof in a first angular position.
Figure 4:
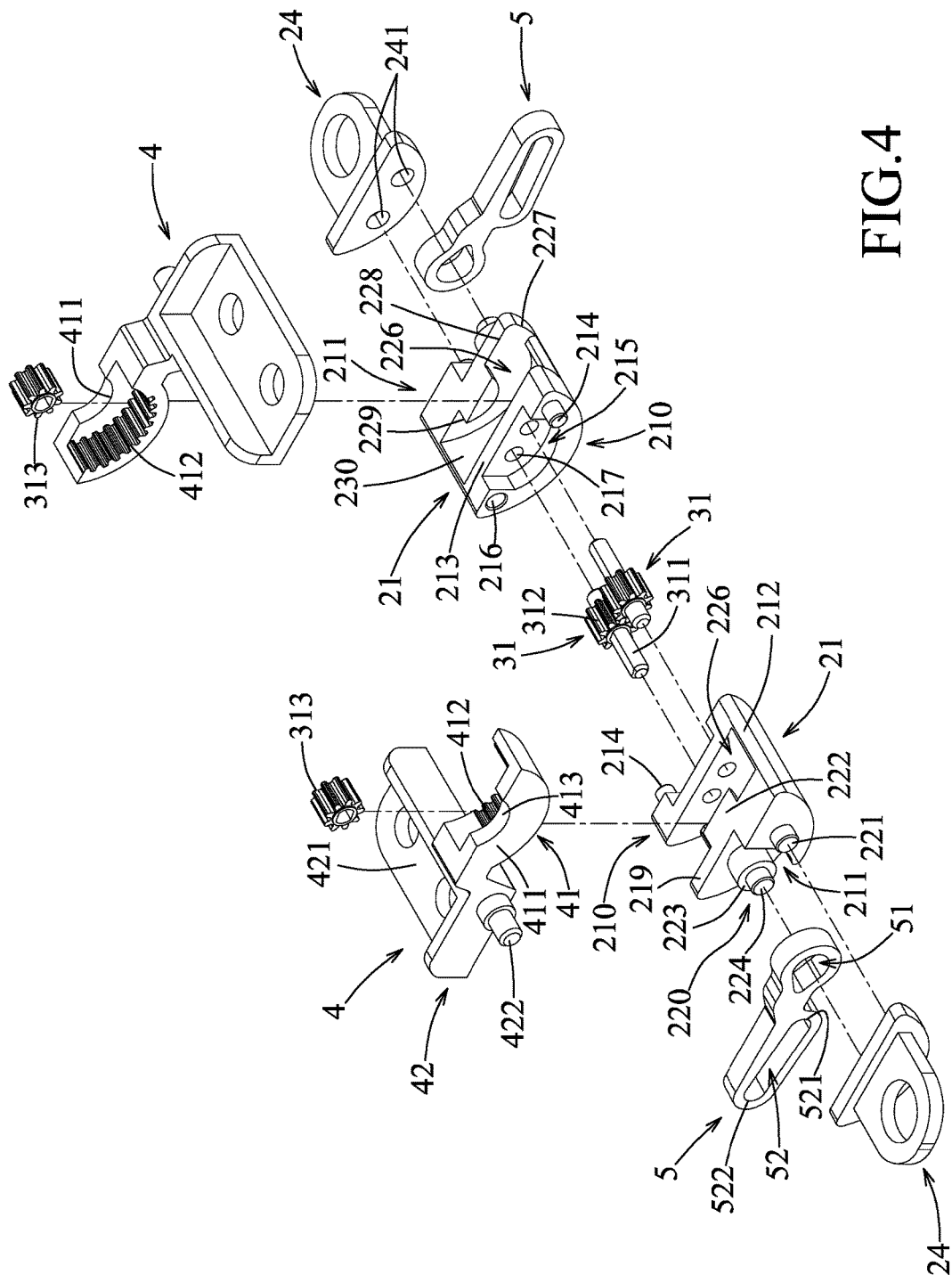
FIG. 4 is an exploded perspective view of the hinge.

With reference to FIGS. 2 to 4, each of the hinges 20 includes a base frame 2, a mechanically transmitting assembly 3, two support frames 4 and two torque linkages 5. The base frame 2 includes two base frame bodies 21 disposed opposite to each other in the front-and-rear direction (Y) and connected to each other, and two end frame bodies 24 disposed opposite to each other in the front-and-rear direction (Y) and respectively connected to front and rear ends of the connected base frame bodies 21.

Each base frame body 21 includes a first wall 210, a second wall 211 which is spaced apart from the first wall 210 in the front-and-rear direction (Y), and an arcuate wall 212 which interconnects the first and second walls 210, 211 and which cooperates with the first and second walls 210, 211 to confine a guideway 226. The first wall 210 has an arched first wall portion 213 formed with a recess 215 and a first positioning hole 216, and a first positioning stem 214 disposed on the first wall portion 213. The first positioning stem 214 and the first positioning hole 216 are disposed at two sides of the recess 215 in the left-and-right direction (X). The first wall portion 213 further has two axial holes 217 in spatial communication with the recess 215 and spaced apart from each other in the left-and-right direction (X). The first positioning stem 214 and the first positioning hole 216 of the front base frame body 21 are engaged with the first positioning hole 216 and the first positioning stem 214 of the rear base frame body 21, respectively, so as to retainingly connect the base frame bodies 21 to each other and to permit the recesses 215 to be in spatial communication with each other to cooperatively define an accommodation space 218 that is located between the guideways 226 (see FIG. 3).

The second wall 211 has an arched second wall portion 219, a pivot pin 220, a second positioning stem 221 and a limit protrusion 222. The pivot pin 220 and the second positioning stem 221 project from the second wall portion 219 and are spaced apart from each other in the left-and-right direction (X). The pivot pin 220 extends in the front-and-rear direction (Y), and has a larger-diameter axial portion 223 and a smaller-diameter axial portion 224. The limit protrusion 222 extends in the guideway 226, and has an upper surface coplanar with that of the second wall portion 219.

Figure 5:
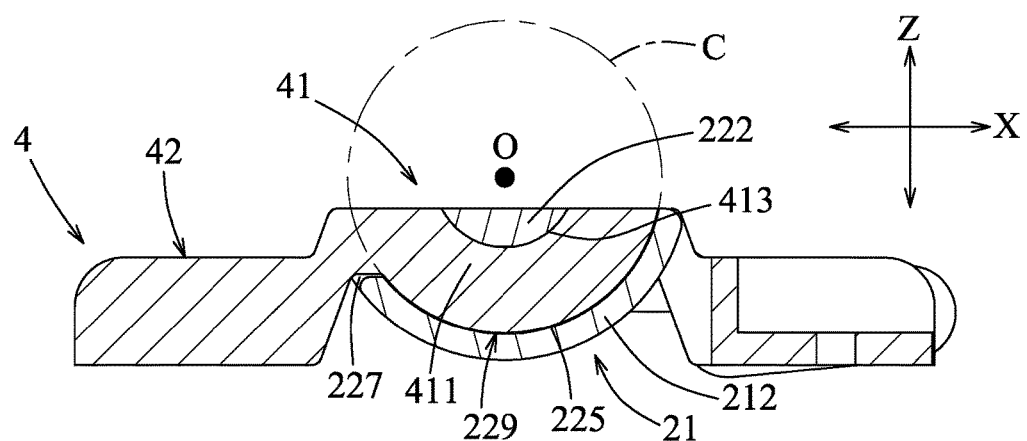
FIG. 5 is a sectional view taken along line S1-S1 of FIG. 3.

Referring to FIGS. 3 to 5, the arcuate wall 212 interconnects bottom ends of the first and second wall portions 213, 219, and is formed with an arcuate surface 225 (see FIG. 5) serving as a bottom portion of the guideway 226 for supporting the respective support frame 4. In this embodiment, the arcuate surface 225 is configured to define a minor arc of a circle which has a center (O) defining a rotating axis (A) that extends parallel to the front-and-rear direction (Y). The rotating axis (A) is disposed above and spaced apart from the base frame 2 in an upright direction (Z) that is transverse to both the left-and-right direction (X) and the front-and-rear direction (Y).

With reference to FIGS. 3 to 6, each guideway 226 has a side opening 227 and an upper opening 228 in spatial communication with the side opening 227. The side openings 227 of the guideways 226 are opened toward left and right sides of the base frame 2, respectively. Specifically, each guideway 226 has an arcuate region 229 (see FIG. 5) proximate to the second wall 211 and under the limit protrusion 222, and an arched region 230 (see FIG. 6) proximate to the first wall 210 and in spatial communication with and between the arcuate region 229 and the axial holes 217.

Each end frame body 24 has two second positioning holes 241 spaced apart from each other in the left-and-right direction (X) to align and engage with the second positioning stem 221 and the smaller-diameter axial portion 224 of the pivot pin 220 so as to retain the end frame body 24 to the respective base frame body 21.

Referring to FIGS. 3, 4, 6 and 7, the mechanically transmitting assembly 3 includes two transmitting units 31 which are disposed opposite to each other in the front-and-rear direction (Y) and which are coupled with each other. Each transmitting unit 31 has a transmitting axle 311 extending in the front-and-rear direction (Y), a driven pinion 312 and a transmitting pinion 313. The transmitting axles 311 of the transmitting units 31 are spaced apart from each other in the left-and-right direction (X). For each transmitting unit 31, the transmitting axle 311 passes through the axial holes 217 to be pivotably connected to the first walls 210. The driven pinion 312 is fixed on the transmitting axle 311 and received in the accommodation space 218. The transmitting pinion 313 is fixed on the transmitting axle 311 and received in the arched region 230 of the respective guideway 226. The transmitting pinion 313 in this embodiment is securely sleeved on the transmitting axle 311. The driven pinions 312 of the transmitting units 31 in this embodiment are integrally formed with the transmitting axles 311, and mesh with each other.

In assembly, the first positioning stem 214 and the first positioning hole 216 of the front base frame body 21 are aligned with the first positioning hole 216 and the first positioning stem 214 of the rear base frame body 21, respectively. The transmitting axles 311 are placed between the base frame bodies 21 to have front and rear ends thereof aligned with the axial holes 217. The transmitting pinions 313 are placed in the arched regions 230, respectively, to be aligned with the axial holes 217. Next, the base frame bodies 21 are moved toward each other to permit passage of the transmitting axles 311 through the axial holes 217 and the transmitting pinions 313. Subsequently, the first positioning stem 214 and the first positioning hole 216 of the front base frame body 21 are engaged with the first positioning hole 216 and the first positioning stem 214 of the rear base frame body 21, respectively, until the first wall portions 213 abut against each other and are welded to firmly connect the base frame bodies 21. In this way, the driven pinions 312 are placed in the accommodation space 218.

Referring to FIGS. 3 to 6, the support frames 4 are disposed opposite to each other in the front-and-rear direction (Y). Each support frame 4 has an arcuate frame body 41 which is configured to be supported on and slidably engage the respective arcuate surface 225, and a support frame body 42 which extends laterally from the arcuate frame body 41 to be disposed outwardly of the base frame body 21 of the base frame 2. The arcuate frame body 41 has a side arcuate wall 411 and an arcuate rack 412 juxtaposed with the side arcuate wall 411. The arcuate frame body 41 is mounted in the guideway 226 from the upper opening 228 such that the side actuate wall 411 and the arcuate rack 412 are respectively and slidably disposed in the arcuate region 229 and the arched region 230. An upper end of the side arcuate wall 411 has a recessed portion 413 configured to slidably abut against the limit protrusion 222. The arcuate rack 412 meshes with the respective transmitting pinion 313 to drive rotation of the transmitting pinion 313 during the sliding movement of the arcuate rack 412 in the arched region 230. With the limit protrusion 222 and the transmitting pinion 313 which are disposed above the side arcuate wall 411 and the arcuate rack 412 to guide the sliding movement of the arcuate frame body 41 in the guideway 226, removal of the arcuate frame body 41 from the guideway 226 through the upper opening 228 can be prevented.

Figure 9:
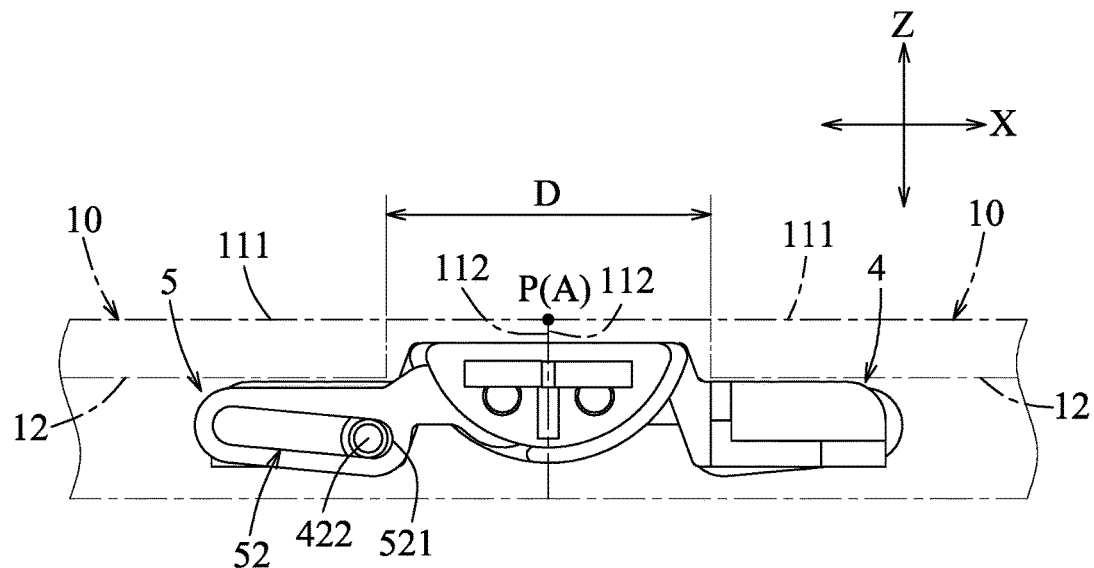
FIG. 9 is a schematic front view of the first embodiment, illustrating the support frames of the hinge in the first angular position, the sections in the unfolded state, and a juncture coaxial with a rotating axis.
Figure 14:
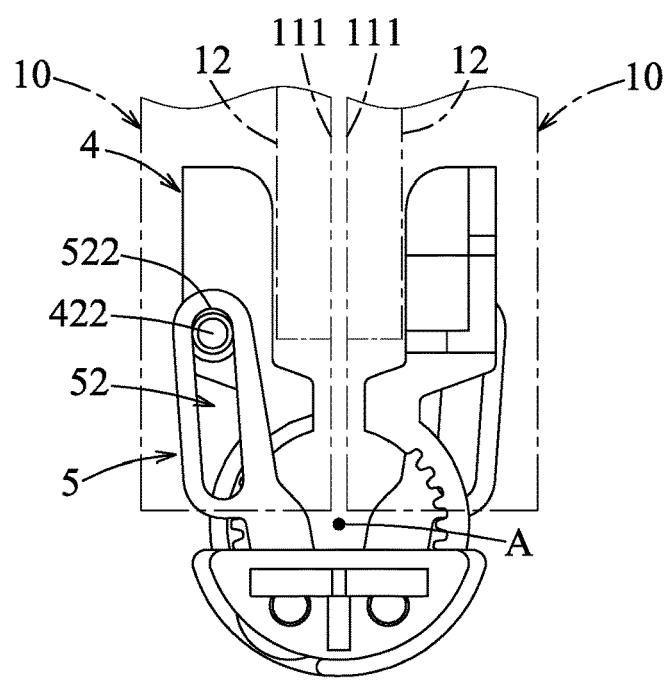
FIG. 14 is a schematic front view of the first embodiment, illustrating the support frames in the second angular position and the sections in a folded state.

The support frame body 42 has a connecting frame portion 421 extending laterally from the arcuate frame body 41, and a guide stem 422 projecting from the connecting frame portion 421 in the front-and-rear direction (Y). The support frame body 42 is disposed laterally of the base frame body 21. The connecting frame portion 421 is fastened to the housing 11 of the respective section 10 (see FIGS. 1 and 2). Thus, each support frame 4 is rotatable about the rotating axis (A) relative to the base frame 2 between a first angular position (as shown in FIG. 9) and a second angular position (as shown in FIG. 14). The support frames 4 can make synchronous rotation in opposite rotational directions through the mechanically transmitting assembly 3 so as to transform the sections 10 between an unfolded state (as shown in FIG. 9) and a folded state (as shown in FIG. 14).

Figure 8:
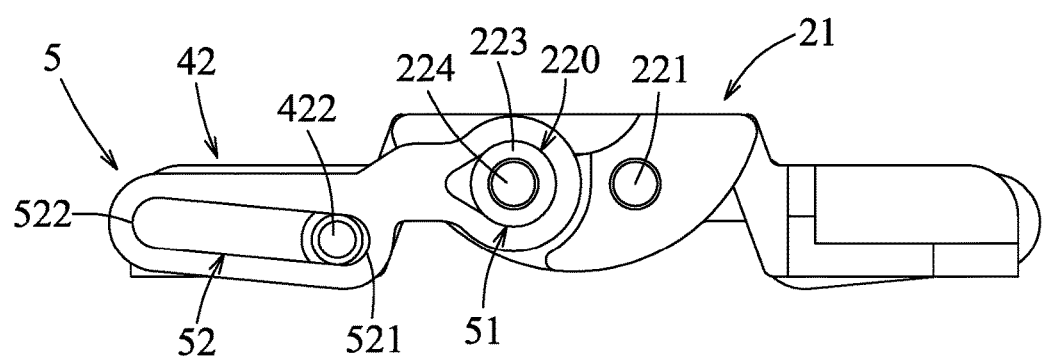
FIG. 8 is a front view of the hinge, an end frame body being removed for the sake of clarity.

With reference to FIGS. 3, 4 and 8, the torque linkages 5 are disposed opposite to each other in the front-and-rear direction (Y). Each torque linkage 5 has a pivot hole 51 and an elongated slot 52 formed opposite to each other in the left-and-right direction (X). The pivot hole 51 is in rotatable and frictional engagement with the larger-diameter axial portion 223 of the respective pivot pin 220. The elongated slot 52 is elongated in the left-and-right direction (X). The guide stem 422 of the respective support frame 4 is disposed in and slidable along the elongated slot 52 to bring the torque linkage 5 in rotation relative to the respective pivot pin 220. The elongated slot 52 has a proximal end 521 proximate to the pivot hole 51, and a distal end 522 distal from the pivot hole 51.

In assembly, each torque linkage 5 is sleeved on the pivot pin 220 and the guide stem 422 to have the larger-diameter axial portion 223 of the pivot pin 220 frictionally engaged in the pivot hole 51, and the guide stem 422 engaged in the elongated slot 52. Subsequently, each end frame body 24 is connected to the second wall 211 of the respective base frame body 21 to have the second positioning stem 221 and the smaller-diameter axial portion 224 of the pivot pin 220 respectively retained in the second positioning holes 241. The end frame body 24 is firmly welded to the second wall portion 219 to restrict removal of the respective torque linkage 5 from the larger-diameter axial portion 223 of the pivot pin 220.

Figure 6:
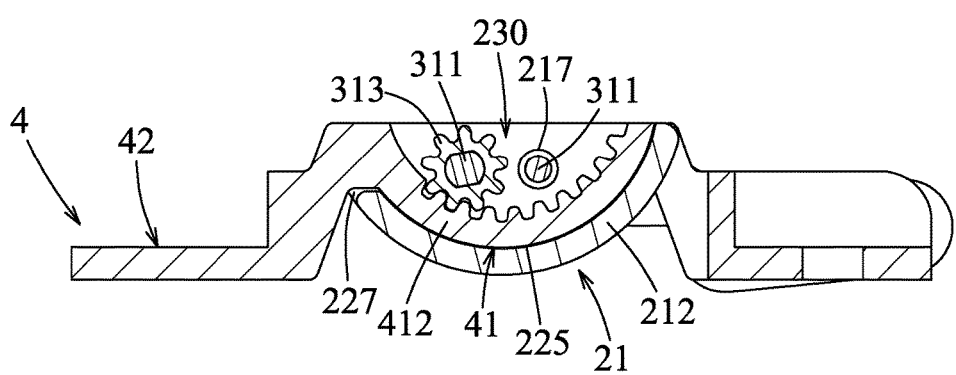
FIG. 6 is a sectional view taken along line S2-S2 of FIG. 3.
Figure 7:
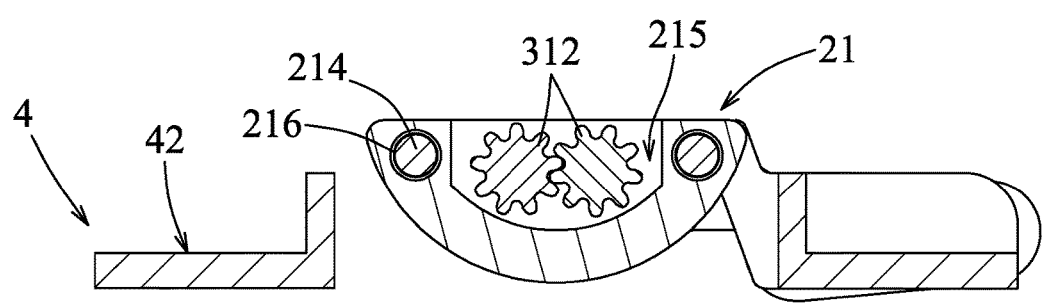
FIG. 7 is a sectional view taken along line S3-S3 of FIG. 3.

With reference to FIGS. 3, 6 and 9, in the first angular position, the arcuate frame body 41 of each support frame 4 is received in the respective guideway 226, and the transmitting pinion 313 meshes with the arcuate rack 412 at an end proximate to the support frame body 42. Also, the support frame body 42 of each support frame 4 projects outwardly of the base frame body 21 through the side opening 227, and the guide stem 422 is placed at the proximal end 521 of the elongated slot 52. Thus, the support frame bodies 42 are remote from each other.

Further, in the first angular position, the sections 10 are in the unfolded state such that the sections 10 are arranged in the left- and right-direction (X), the major surfaces 111 are coplanar, and the minor surfaces 112 are close to and face each other. In the unfolded state, the juncture (P) of the major surface 111 and the minor surface 112 is not located above the rotating axis (A). In this embodiment, the juncture (P) is located at the rotating axis (A) and coaxial with the rotating axis (A).

With reference to FIGS. 10 to 13, the sections 10 are rotated respectively in opposite first and second rotational directions (R1, R2) to transform to the folded state. The left support frame 4 is rotated with the left section 10 in the first rotational direction (R1) such that the arcuate frame body 41 slides along the arcuate surface 225 of the arcuate wall 212 (about the rotating axis (A)) to project above the base frame body 21 through the upper opening 228 while the support frame body 42 is gradually moved away from the side opening 227. Through synchronous rotation of the transmitting units 31 of the mechanically transmitting assembly 3, the right support frame 4 is rotated in the second rotational direction (R2) such that the arcuate frame body 41 of the right support frame 4 slides along the respective arcuate surface 225 to project above the respective base frame body 21 while the support frame body 42 of the right support frame 4 is moved close to the support frame body 42 of the left support frame 4 to the second angular position.

Figure 10:
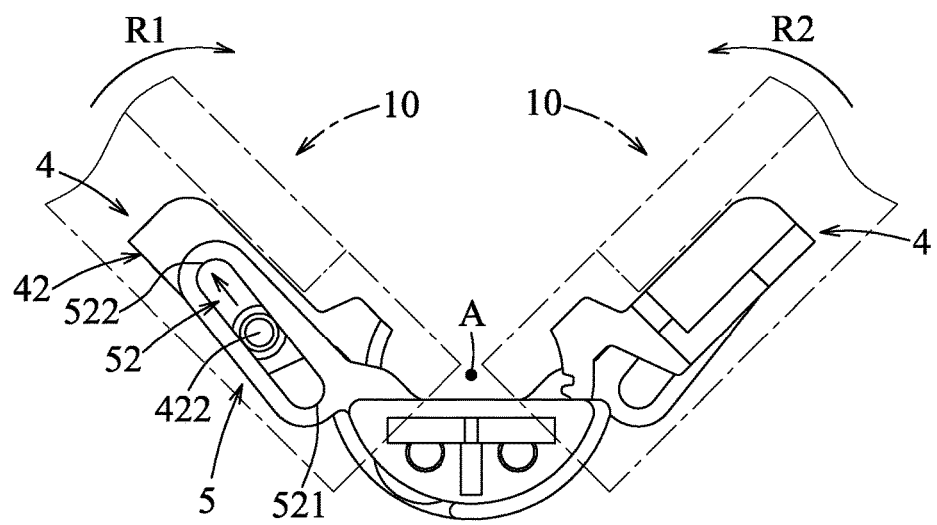
FIG. 10 is a schematic front view of the first embodiment, illustrating the sections rotated toward the folded state.
Figure 11:
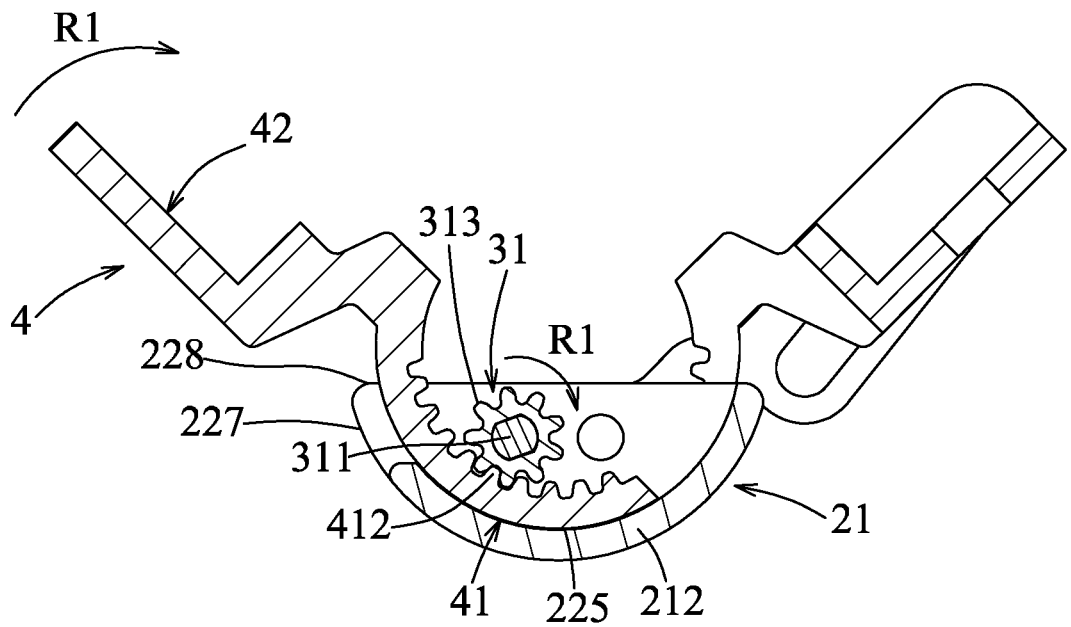
FIG. 11 is a sectional view of the hinge, illustrating the support frames of the hinge rotated toward a second angular position.
Figure 12:
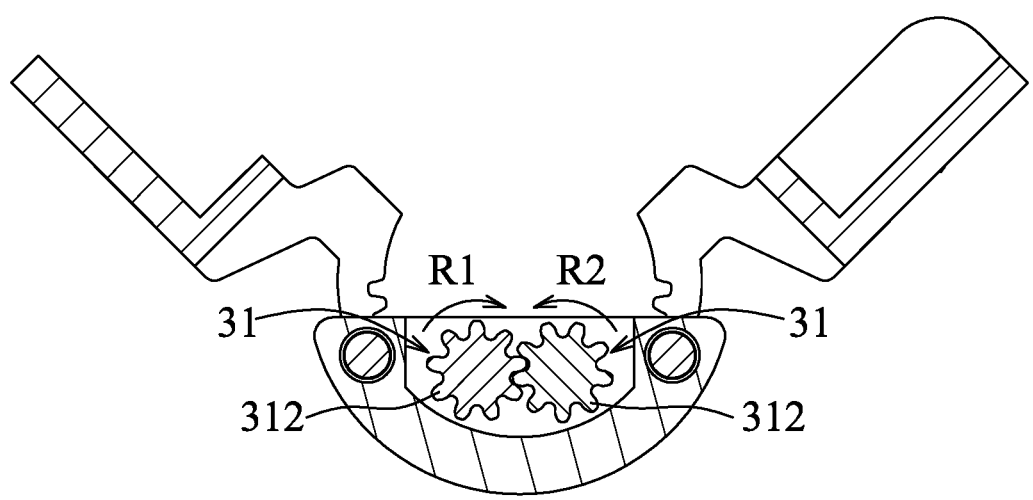
FIG. 12 is a view similar to FIG. 7, illustrating the support frames of the hinge rotated toward the second angular position.
Figure 13:
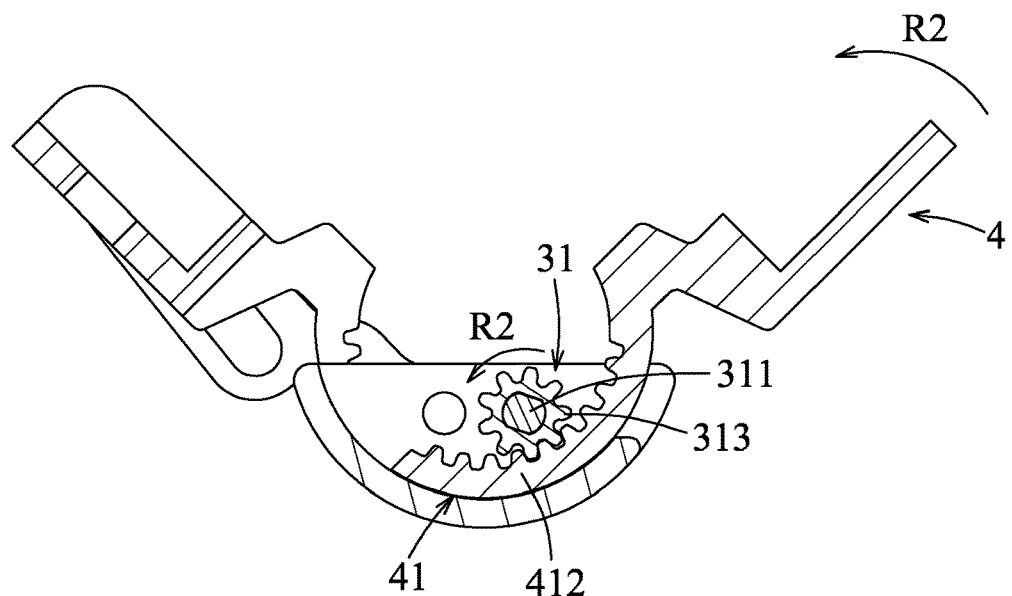
FIG. 13 is a sectional view of the hinge, illustrating the support frames of the hinge rotated toward the second angular position.

With reference to FIGS. 8, 10 and 11, during the rotation of the support frames 4, the guide stem 422 of each support frame 4 is moved about the rotating axis (A) and along the elongated slot 52 toward the distal end 522 to be gradually away from the base frame body 21 so as to bring the torque linkage 5 in rotation relative to the pivot pin 220. With the frictional engagement of the pivot hole 51 of the torque linkage 5 with the larger-diameter axial portion 223 of the pivot pin 220, a torque is generated relative to the pivot pin 220 so as to permit the support frame 4 to be retained in any desired angular position relative to the base frame 2.

Figure 15:
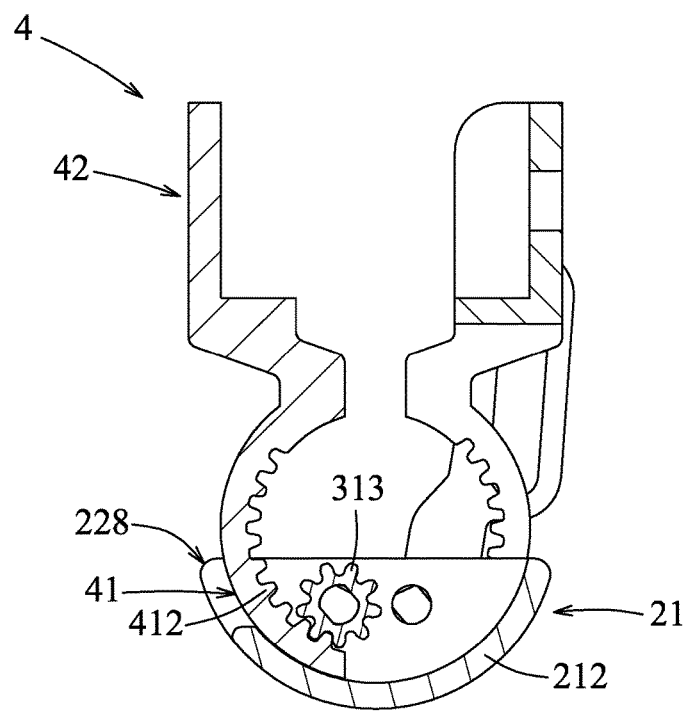
FIG. 15 is a sectional view of the hinge, illustrating the support frames in the second angular position.

Referring to FIGS. 14 and 15, in the second angular position, each arcuate frame body 41 partly projects above the base frame body 21, and the transmitting pinion 313 meshes with the arcuate rack 412 at an end distal from the support frame body 42. Also, the guide stem 422 of each support frame body 42 is placed at the distal end 522 of the elongated slot 52. Thus, the support frames 4 stand uprightly and the support frame bodies 42 are close to each other. In this position, the sections 10 are in the folded state, where the major surfaces 111 face each other, and the display screens 12 face each other.

Referring to FIGS. 9 to 11, when it is desired to unfold the sections 10 from the folded state, the sections 10 are rotated respectively in the second and first rotational directions (R2, R1) to make synchronous rotation of the support frames 4. During the rotation, the arcuate frame body 41 of each support frame 4 slides about the rotating axis (A) to gradually retract in the guideway 226 from the upper opening 228. The guide stem 422 of the support frame body 42 is moved about the rotating axis (A) along the elongated slot 52 toward the proximal end 521 so as to rotate the torque linkage 5 relative to the pivot pin 220. The sections 10 are moved to permit the minor surfaces 112 to abut against each other so as to transform the sections 10 back to the unfolded state.

In this embodiment, with the rotating axis (A) located above and spaced apart from the base frame 2 in the upright direction (Z), and with the juncture (P) located at and coaxial with the rotating axis (A), the minor surfaces 112 of the sections 10 can abut against each other without any gap therebetween. Thus, the distance (D) between the display screens 12 can be minimized. Moreover, since the base frame bodies 21, the end frame bodies 24 and the torque linkages 5 are connected in the front-and-rear direction (Y), since the base frame bodies 21 are configured to have the accommodation space 218 for receiving the driven pinions 312, and since each base frame body 21 is formed with the guideway 226 for accommodating the transmitting pinion 313, the height of the base frame 2 in the upright direction (Z) and the length of the base frame 2 in the left-and-right direction (X) can be reduced. Furthermore, with the guideway 226 formed in each base frame body 21 for supporting the support frame 4, the lengths of the support frame 4 and the base frame body 21 in the left-and-right direction (X) can be reduced when the support frames 4 are in the first angular position. Specifically, the height of the hinge 20 in the upright direction (Z) and the length of the hinge 20 in the left-and-right direction (X) can be reduced, which renders the hinge 20 compact.

Figure 16:
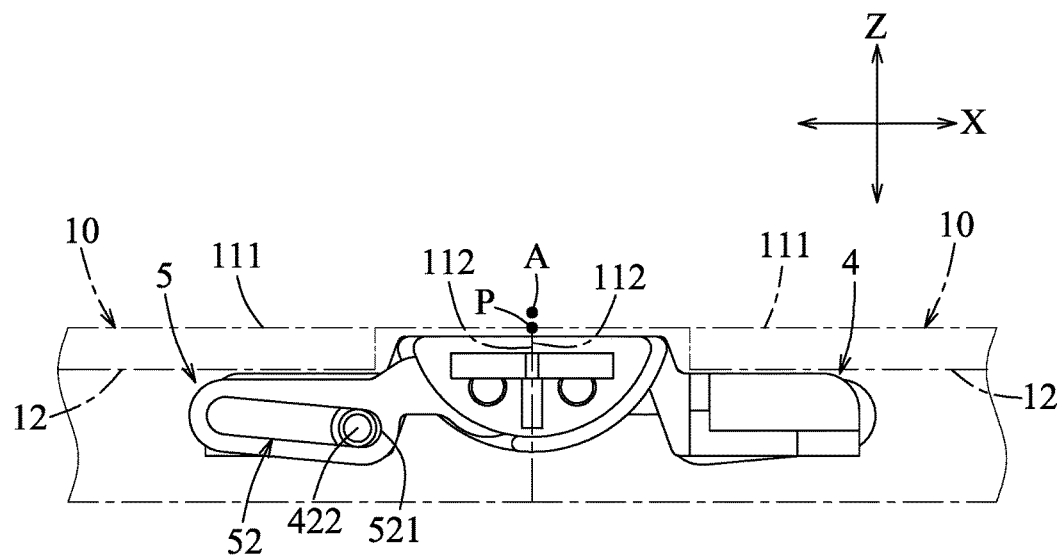
FIG. 16 is a schematic front view of a second embodiment of the foldable electronic device according to the disclosure.

Referring to FIG. 16, in a second embodiment, the juncture (P) is located below and spaced apart from the rotating axis (A) in the upright direction (Z). With the rotating axis (A) disposed above the base frame 2, and the juncture (P) below the rotating axis (A), the minor surfaces 112 can abut against each other without any gap therebetween when the sections 10 are in the unfolded state, thereby minimizing the distance (D) between the display screens 12.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A hinge comprising:
a base frame defining two guideways which are disposed opposite to each other in a front-and-rear direction and which are spaced apart from each other in the front-and-rear direction;
a mechanically transmitting assembly mounted on said base frame and partly disposed in said guideways; and
two support frames disposed opposite to each other in the front-and-rear direction, each of said support frames having an arcuate frame body which is configured to slidably engage a respective one of said guideways and which is coupled with said mechanically transmitting assembly, and a support frame body which extends laterally from said arcuate frame body to be disposed outwardly of said base frame, said support frames being rotatable about a rotating axis relative to said base frame to make synchronous rotation in opposite rotational directions through said mechanically transmitting assembly, the rotating axis being parallel to the front-and-rear direction and disposed above and spaced apart from said base frame in an upright direction.

2. The hinge as claimed in claim 1, wherein said base frame has two arcuate surfaces each serving as a bottom portion of the respective one of said guideways for supporting said arcuate frame body, each of said arcuate surfaces defining a minor arc of a circle which has a center defining the rotating axis.

3. The hinge as claimed in claim 2, wherein each of said support frames is rotatable relative to said base frame between a first angular position, where said arcuate frame body is received in the respective one of said guideways and said support frame bodies of said support frames are remote from each other, and a second angular position, where said arcuate frame body partly projects above said base frame and said support frame bodies of said support frames are close to each other.

4. The hinge as claimed in claim 3, wherein each of said guideways has a side opening and an upper opening in spatial communication with said side opening, said side openings of said guideways being opened toward left and right sides of said base frame, respectively, such that, in the first angular position, said support frame bodies project outwardly of said base frame through said side openings, respectively, and in the second angular position, said arcuate frame bodies project above said base frame through said upper openings, respectively.

5. The hinge as claimed in claim 4, wherein said arcuate frame body has an arcuate rack, said base frame further defining an accommodation space which is located between said guideways, said mechanically transmitting assembly including two transmitting units which are disposed opposite to each other in the front-and-rear direction and which are coupled with each other, each of said transmitting units having a transmitting axle which is pivotably connected to said base frame and which extends in the front-and-rear direction, a driven pinion which is fixed on said transmitting axle and which is received in said accommodation space, and a transmitting pinion which is fixed on said transmitting axle, which is received in the respective one of said guideways, and which meshes with said arcuate rack, said driven pinions of said transmitting units meshing with each other to make synchronous rotation of said transmitting units.

6. The hinge as claimed in claim 5, wherein said base frame has two pivot pins which are disposed opposite to each other in the front-and-rear direction and each of which extends in the front-and-rear direction, said support frame body having a guide stem, said hinge further comprising two torque linkages which are disposed opposite to each other in the front-and-rear direction, each of said torque linkages having a pivot hole which is in frictional engagement with a respective one of said pivot pins, and an elongated slot which is elongated in a left-and-right direction that is transverse to the front-and-rear direction, said guide stem being disposed in and slidable along said elongated slot to bring a respective one of said torque linkages in rotation relative to the respective one of said pivot pins.

7. The hinge as claimed in claim 6, wherein said base frame has two base frame bodies which are disposed opposite to each other in the front-and-rear direction and which are connected to each other, each of said base frame bodies having a first wall, a second wall which is spaced apart from said first wall in the front-and-rear direction, and an arcuate wall which interconnects said first and second walls and which cooperates with said first and second walls to confine the respective one of said guideways, said first wall having a recess, said first walls of said base frame bodies being connected to each other to permit said recesses to be in spatial communication with each other to cooperatively define said accommodation space, said transmitting axles of said transmitting units being pivotably connected to said first walls and being spaced apart from each other in the left-and-right direction, said second wall having a limit protrusion which extends in the respective guideway, said arcuate wall having a respective one of said arcuate surfaces formed thereon, said arcuate frame body having a side arcuate wall which is juxtaposed with said arcuate rack and which has an upper wall portion that slidably abuts against said limit protrusion.

8. The hinge as claimed in claim 7, wherein said base frame has two end frame bodies which are disposed opposite to each other in the front-and-rear direction and each of which is connected to said second wall of a respective one of said base frame bodies to restrict removal of a respective one of said torque linkages from a respective one of said pivot pins.

9. The hinge as claimed in claim 1, wherein said arcuate frame body has an arcuate rack, said mechanically transmitting assembly including two transmitting units which are disposed opposite to each other in the front-and-rear direction and which are coupled with each other, each of said transmitting units having a transmitting axle which is pivotably connected to said base frame and which extends in the front-and-rear direction, a driven pinion which is fixed on said transmitting axle, and a transmitting pinion which is fixed on said transmitting axle and which meshes with said arcuate rack, said driven pinions of said transmitting units meshing with each other to make synchronous rotation of said transmitting units.

10. The hinge as claimed in claim 1, further comprising two torque linkages which are disposed opposite to each other in the front-and-rear direction, each of said torque linkages being configured to be in frictional engagement with and pivotably connected to said base frame, and movably connected to said support frame body of a respective one of said support frames to bring said torque linkages in rotation relative to said base frame.

11. A foldable electronic device comprising:
two sections each having a major surface and a minor surface which is connected to said major surface at a juncture; and
a hinge interconnecting said sections, and including:
a base frame defining two guideways which are disposed opposite to each other in a front-and-rear direction and which are spaced apart from each other in the front-and-rear direction;
a mechanically transmitting assembly mounted on said base frame and partly disposed in said guideways; and
two support frames disposed opposite to each other in the front-and-rear direction, each of said support frames having an arcuate frame body which is configured to slidably engage a respective one of said guideways and which is coupled with said mechanically transmitting assembly, and a support frame body which extends laterally from said arcuate frame body to be disposed outwardly of said base frame and which is retainingly connected to a respective one of said sections, said support frames being rotatable about a rotating axis relative to said base frame to make synchronous rotation in opposite rotational directions through said mechanically transmitting assembly so as to transform said sections between an unfolded state, where said sections are arranged in a left-and-right direction transverse to the front-and-rear direction, said major surfaces of said sections are coplanar, and said minor surfaces face each other, and a folded state, where said major surfaces face each other, the rotating axis being parallel to the front-and-rear direction and disposed above and spaced apart from said base frame in an upright direction such that, in the unfolded state, the juncture is not located above the rotating axis.

12. The foldable electronic device as claimed in claim 11, wherein said base frame has two arcuate surfaces each serving as a bottom portion of the respective one of said guideways for supporting said arcuate frame body, each of said arcuate surfaces defining a minor arc of a circle which has a center defining the rotating axis such that, in the unfolded state, the juncture is located at the rotating axis or below the rotating axis.

13. The foldable electronic device as claimed in claim 12, wherein each of said support frames is rotatable relative to said base frame between a first angular position, where said arcuate frame body is received in the respective one of said guideways and said support frame bodies of said support frames are remote from each other to bring said sections in the unfolded state, and a second angular position, where said arcuate frame body partly projects above said base frame and said support frame bodies of said support frames are close to each other to bring said sections in the folded state.

14. The foldable electronic device as claimed in claim 13, wherein each of said guideways has a side opening and an upper opening in spatial communication with said side opening, said side openings of said guideways being opened toward left and right sides of said base frame such that, in the first angular position, said support frame bodies project outwardly of said base frame through said side openings, respectively, and in the second angular position, said arcuate frame bodies project above said base frame through said upper openings, respectively.

15. The foldable electronic device as claimed in claim 14, wherein said arcuate frame body has an arcuate rack, said base frame further defining an accommodation space which is located between said guideways, said mechanically transmitting assembly including two transmitting units which are disposed opposite to each other in the front-and-rear direction and which are coupled with each other, each of said transmitting units having a transmitting axle which is pivotably connected to said base frame and which extends in the front-and-rear direction, a driven pinion which is fixed on said transmitting axle and which is received in said accommodation space, and a transmitting pinion which is fixed on said transmitting axle, which is received in the respective one of said guideways, and which meshes with said arcuate rack, said driven pinions of said transmitting units meshing with each other to make synchronous rotation of said transmitting units.

16. The foldable electronic device as claimed in claim 15, wherein said base frame has two pivot pins which are disposed opposite to each other in the front-and-rear direction and each of which extends in the front-and-rear direction, said support frame body having a guide stem, said hinge further comprising two torque linkages which are disposed opposite to each other in the front-and-rear direction, each of said torque linkages having a pivot hole which is in frictional engagement with a respective one of said pivot pins, and an elongated slot which is elongated in the left-and-right direction, said guide stem being disposed in and slidable along said elongated slot to bring a respective one of said torque linkages in rotation relative to the respective one of said pivot pins.

17. The foldable electronic device as claimed in claim 16, wherein said base frame has two base frame bodies which are disposed opposite to each other in the front-and-rear direction and which are connected to each other, each of said base frame bodies having a first wall, a second wall which is spaced apart from said first wall in the front-and-rear direction, and an arcuate wall which interconnects said first and second walls and which cooperates with said first and second walls to confine the respective one of said guideways, said first wall having a recess, said first walls of said base frame bodies being connected to each other to permit said recesses to be in spatial communication with each other to cooperatively define said accommodation space, said transmitting axles of said transmitting units being pivotably connected to said first walls and being spaced apart from each other in the left-and-right direction, said second wall having a limit protrusion which extends in the respective guideway, said arcuate wall having a respective one of said arcuate surfaces formed thereon, said arcuate frame body having a side arcuate wall which is juxtaposed with said arcuate rack and which has an upper wall portion that slidably abuts against said limit protrusion.

18. The foldable electronic device as claimed in claim 17, wherein said base frame has two end frame bodies which are disposed opposite to each other in the front-and-rear direction and each of which is connected to said second wall of a respective one of said base frame bodies to restrict removal of a respective one of said torque linkages from a respective one of said pivot pins.

19. The foldable electronic device as claimed in claim 11, wherein said arcuate frame body has an arcuate rack, said mechanically transmitting assembly including two transmitting units which are disposed opposite to each other in the front-and-rear direction and which are coupled with each other, each of said transmitting units having a transmitting axle which is pivotably connected to said base frame and which extends in the front-and-rear direction, a driven pinion which is fixed on said transmitting axle, and a transmitting pinion which is fixed on said transmitting axle and which meshes with said arcuate rack, said driven pinions of said transmitting units meshing with each other to make synchronous rotation of said transmitting units.

20. The foldable electronic device as claimed in claim 11, further comprising two torque linkages which are disposed opposite to each other in the front-and-rear direction, each of said torque linkages being configured to be in frictional engagement with and pivotably connected to said base frame, and movably connected to said support frame body of a respective one of said support frames to bring said torque linkages in rotation relative to said base frame.

* * * * *